(12) United States Patent
Pesetski et al.

(10) Patent No.: US 8,461,862 B2
(45) Date of Patent: Jun. 11, 2013

(54) QUANTUM PROCESSOR

(75) Inventors: Aaron A. Pesetski, Gambrills, MD (US); James E. Baumgardner, Odenton, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 16 days.

(21) Appl. No.: 13/307,703

(22) Filed: Nov. 30, 2011

(65) Prior Publication Data

US 2012/0144159 A1 Jun. 7, 2012

Related U.S. Application Data

(62) Division of application No. 12/957,940, filed on Dec. 1, 2010, now Pat. No. 8,111,083.

(51) Int. Cl.
*H03K 19/195* (2006.01)
*H03K 17/92* (2006.01)
*H03K 3/38* (2006.01)
*H01L 29/06* (2006.01)

(52) U.S. Cl.
USPC .................. 326/3; 327/367; 327/528; 257/14

(58) Field of Classification Search
USPC ..................... 326/1–5; 257/14; 327/366–367, 327/527–528
See application file for complete search history.

(56) References Cited

U.S. PATENT DOCUMENTS

| | | | |
|---|---|---|---|
| 6,770,916 B2 * | 8/2004 | Ohshima | 257/104 |
| 7,219,018 B2 | 5/2007 | Vitaliano et al. | |
| 7,230,266 B2 | 6/2007 | Hilton et al. | |
| 7,498,832 B2 * | 3/2009 | Baumgardner et al. | 326/7 |
| 7,613,764 B1 * | 11/2009 | Hilton et al. | 708/801 |
| 7,613,765 B1 | 11/2009 | Hilton et al. | |
| 7,893,708 B2 * | 2/2011 | Baumgardner et al. | 326/7 |
| 2004/0173793 A1 * | 9/2004 | Blais et al. | 257/31 |
| 2005/0001209 A1 * | 1/2005 | Hilton et al. | 257/20 |
| 2008/0131047 A1 | 6/2008 | Beausoleil et al. | |

FOREIGN PATENT DOCUMENTS

| WO | WO 2004/012139 A2 | 2/2004 |
|---|---|---|
| WO | WO 2009/149086 A2 | 12/2009 |
| WO | WO 2009/152180 A2 | 12/2009 |
| WO | WO 2010/028183 A2 | 3/2010 |

\* cited by examiner

*Primary Examiner* — Thienvu Tran
(74) *Attorney, Agent, or Firm* — Tarolli, Sundheim, Covell & Tummino LLP

(57) ABSTRACT

One embodiment of the invention includes a quantum processor system. The quantum processor system includes a first resonator having a first characteristic frequency and a second resonator having a second characteristic frequency greater than the first characteristic frequency. A qubit cell is coupled to each of the first resonator and the second resonator. The qubit cell has a frequency tunable over a range of frequencies including the first characteristic frequency and the second characteristic frequency. A classical control mechanism is configured to tune the frequency of the qubit cell as to transfer quantum information between the first resonator and the second resonator.

9 Claims, 3 Drawing Sheets

QUANTUM PROCESSOR

RELATED APPLICATIONS

The present invention is a divisional application of U.S. patent application Ser. No. 12/957,940, filed 1 Dec. 2010 now U.S. Pat. No. 8,111,083, which is incorporated herein in its entirety.

TECHNICAL FIELD

The present invention relates generally to quantum computing systems, and specifically to a quantum processor.

BACKGROUND

A classical computer operates by processing binary bits of information that change state according to the laws of classical physics. These information bits can be modified by using simple logic gates such as AND and OR gates. The binary bits are physically created by a high or a low energy level occurring at the output of the logic gate to represent either a logical one (e.g., high voltage) or a logical zero (e.g., low voltage). A classical algorithm, such as one that multiplies two integers, can be decomposed into a long string of these simple logic gates. Quantum computing processes also manipulate bits of information with logical gates, but instead of using logical ones and zeroes, a quantum bit ("qubit") can be generated that occupies both possibilities simultaneously. Accordingly, it is expected that quantum computing may be able to solve a large class of problems with exponentially greater efficiency than that of a classical computer.

SUMMARY

In accordance with one aspect of the present invention, a quantum processor system includes a first resonator having a first characteristic frequency and a second resonator having a second characteristic frequency greater than the first characteristic frequency. A qubit cell is coupled to each of the first resonator and the second resonator. The qubit cell has a frequency tunable over a range of frequencies including the first characteristic frequency and the second characteristic frequency. A classical control mechanism is configured to tune the frequency of the qubit cell as to transfer quantum information between the first resonator and the second resonator.

In accordance with another aspect of the present invention, a quantum processor system includes a plurality of resonators configured to store quantum information. A first set of a plurality of qubit cells is configured for a first logical operation. Each of the first set of qubit cells is coupled to at least one of the plurality of resonators. A second set of the plurality of qubit cells is configured for a second logical operation. Each of the second set of qubit cells is coupled to at least one of the plurality of resonators. A third set of the plurality of qubit cells is configured for a third logical operation. Each of the third set of qubit cells is coupled to at least one of the plurality of resonators.

In accordance with yet another aspect of the present invention, a method is provided for performing a logical gate operation at a quantum processor system. An item of quantum information is transferred from a first resonator to a first qubit coupled to a second resonator. The first qubit has a first structure optimal for use in a multiple qubit logic gate operation. A quantum logic gate operation is performed on the first qubit controlled by a logical state of at least a second qubit coupled to the second resonator as to produce a processed item of quantum information. The processed item of quantum information is transferred from the second resonator to a third qubit coupled to a third resonator. The third qubit has a second structure configured to allow high fidelity read operations on quantum information stored in the third qubit. The processed item of quantum information is read from the third qubit as a logical output.

DETAILED DESCRIPTION

Figure 1:
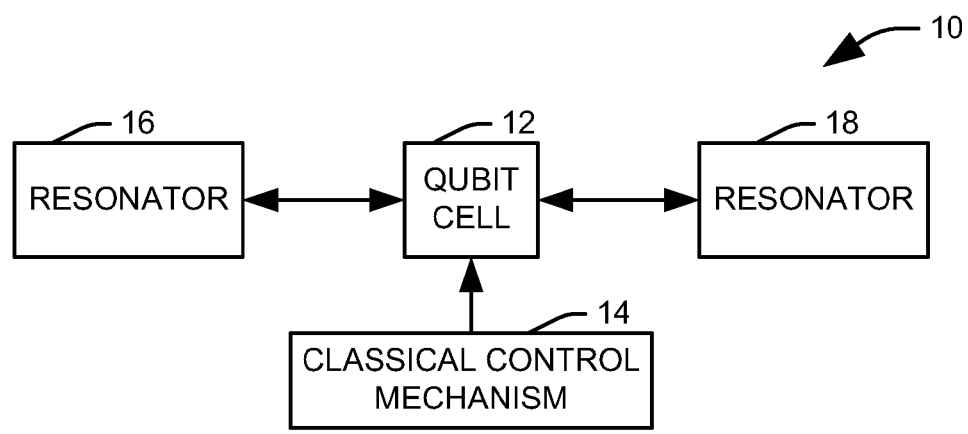
FIG. 1 illustrates an example of a quantum processor in accordance with an aspect of the invention.

The present invention relates generally to quantum computing systems, and specifically to quantum processor assemblies for carrying out quantum logic operations. A quantum processor can include a plurality of storage media for quantum information and at least one mechanism for passing quantum information between discrete units of the storage media without substantial change to the information. An immediate benefit of a processor architecture in accordance with an aspect of the present invention is the ability to utilize specialized components to implement various logical gates and other operations, allowing for an efficient implementation of the processor functions.

As used herein, a resonator is a physical assembly having a plurality of quantum states that can be used to store all or a portion of a quantum bit of information. For example, a resonator can be implemented as a transmission line, a resonant cavity, or any other structure appropriate for a given application. In general, a resonator will have a characteristic frequency that is constant, although it will be appreciated that a tunable resonator assembly can be used where required by a given application. A qubit cell is a physical assembly having a plurality of energy states that are tunable in response to a control mechanism. For example, the qubit cell can be implemented as an oscillator that can transfer energy between some combination of an electric field of a capacitor, a magnetic field of an inductor, and a superconducting phase difference. Exemplary implementations of a qubit cell can include one or more of a Josephson junction, a quantum dot, a SQUID (superconducting quantum interference device), a Cooper pair box, and an ion trap. To maintain consistent and unambiguous terminology, the term "qubit" will refer hereinafter to an item of quantum information stored in one or more resonators or qubit cells.

Each assembly can include a plurality of resonators configured to store quantum information and a plurality of qubit cells configured to manipulate the quantum information stored in the resonators. It will be appreciated that a given item of quantum information is not limited to a physical quantum state of a given resonator or qubit cell, but rather could represent a linear superposition of multiple physical quantum states of a resonator or qubit cell storing the information. It will further be appreciated that a given item of quantum information can be stored in multiple qubit cells and resonators and be represented by linear superpositions of the physical quantum states of each of the multiple qubit cells and resonators. Further, where any two components of the invention are described as "coupled," it will be appreciated that the term is intended to encompass not only a means of physical coupling, such as a mechanical coupling by means of an electrical conductor, but also any other appropriate coupling means including capacitive, inductive, magnetic, nuclear, and optical coupling, or any combination of the foregoing.

FIG. 1 illustrates a quantum processor 10 in accordance with an aspect of the invention. The illustrated quantum system 10 includes at least one qubit cell 12 having an associated classical control mechanism 14. The term "classical" implies that the manner of control behaves generally according to the laws of classical physics. For example, the classical control mechanism can adjust the frequency, and thus the corresponding energy of the qubit by altering the magnitude of a classical control parameter, such as a one of current, voltage, or magnetic flux provided to the qubit cell. In the illustrated processor 10, the classical control mechanism 14 can transition the classical control parameter via two distinct operations. One is an adiabatic sweep, that is, a transition that is slow relative to a characteristic energy of the sweeping system. During a sweep, the state of the qubit tracks an energy contour of the system as the control parameter is adjusted. The second is a jump, a transition that is rapid relative to the characteristic energy of the system. Jumps take advantage of symmetries of the Hamiltonian to instantaneously change the energy of the system without changing the quantum state of the system.

The quantum processor 10 includes a first resonator 16 and a second resonator 18, each coupled o the qubit cell. It will be appreciated that the implementation of the resonator is not restricted to a particular technology, and for example, the first and second resonators 16 and 18 can be configured as transmission line resonators, lumped element resonators, distributed resonators, or a combination thereof. As another example, the first and second resonators 16 and 18 can be formed from a coplanar, strip line, microstrip, slot line, or coaxial waveguide comprising a capacitive or inductive gap at each respective end. The quantum processor 10 is configured such that quantum information, represented by a logical qubit, can be transitioned between a first resonator 16 and a second resonator 18 via manipulation of the classical control mechanism 14.

Figure 2:
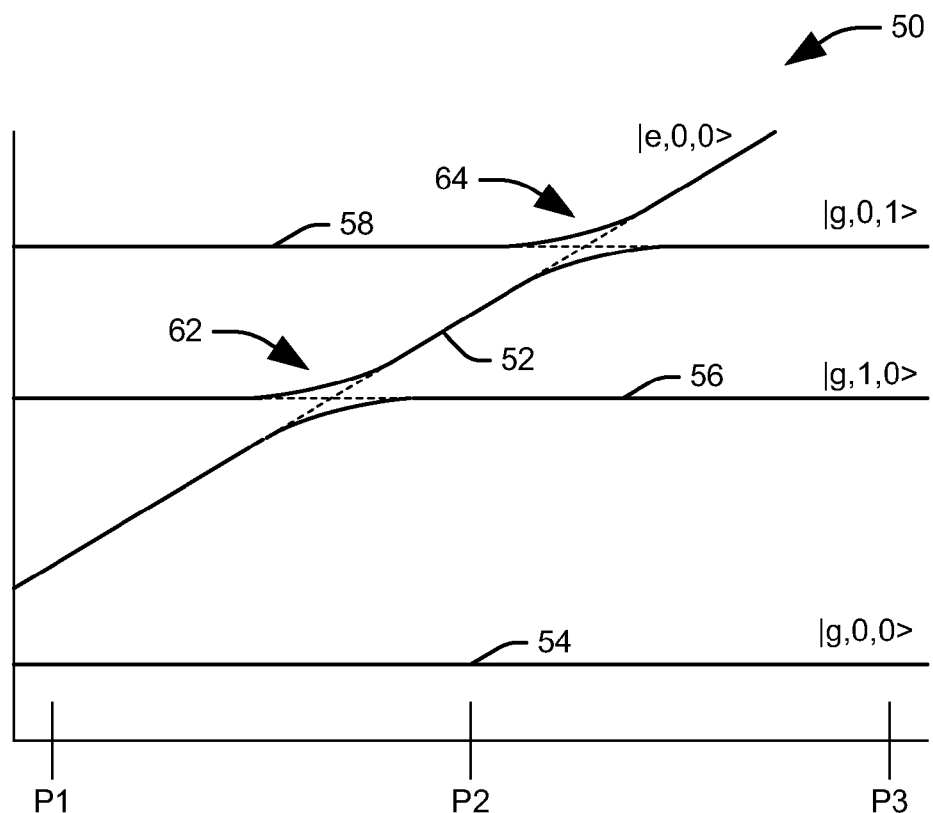
FIG. 2 illustrates an example of an energy diagram in accordance with an aspect of the invention.

In accordance with an aspect of the present invention, each of the resonators 16 and 18 coupled to the qubit cell 12 has a different resonant frequency, such that a first excited state of the first resonator 16 has an energy different from that of a first excited state of the second resonator 18. As an example, the first resonator can have a frequency of approximately 10 GHz, and the second resonator can have a frequency of approximately 15 GHz. The energy states of the resonator/qubit cell/resonator system of FIG. 1 are illustrated as an energy diagram 50 in FIG. 2.

In the illustrated energy diagram 50, an energy of the resonator/qubit cell/resonator system is represented by the vertical axis and a value of the classical control parameter on the horizontal axis. As an example, P1 can correspond to a first value of the classical control parameter that produces a frequency at the qubit cell that is less than 10 GHz, P2 can correspond to a second value of the classical control parameter that produces a frequency at the qubit cell that is between 10 GHz and 15 GHz, and P3 can correspond to a third value of the classical control parameter that produces a frequency at the qubit cell that is greater than 15 GHz. A more detailed explanation of the energy diagram 50, as well as manipulating the energy states between the first qubit 12 and the resonators 16 and 18 to perform a number of quantum logic gates, is described in U.S. Pat. No. 7,498,832, titled "ARBITRARY QUANTUM OPERATIONS WITH A COMMON COUPLED RESONATOR," and U.S. application Ser. No. 12/748,923, titled "QUANTUM GATE OPERATIONS WITH A COMMON COUPLED RESONATOR", each of which is hereby incorporated by reference.

The energy diagram 50 illustrates a first state 52, represented in ket notation as |e, 0, 0>, in which the qubit cell 12 is in an excited state and the two resonators 16 and 18 are in a ground state. The first state 52 is represented as a diagonal line on the energy diagram 50 of FIG. 2. The energy diagram 50 further includes three states 54, 56, and 58 in which the qubit cell 12 is in a ground state, each represented by a horizontal line within the diagram. In a second energy state 54, represented in ket notation as |g, 0, 0>, each of the qubit cell 12, the first resonator 16, and the second resonator 18 are in a ground state. In a third energy state 56, represented in ket notation as |g, 1, 0>, each of the qubit cell and the second resonator are in a ground state, while the first resonator is in an excited state. In a fourth energy state 58, represented in ket notation as |g, 0, 1>, each of the qubit cell and the first resonator are in a ground state, while the second resonator is in an excited state.

As is illustrated in the diagram, the coupling between the qubit cell 12 and the first resonator 16 results in a first avoided crossing 62 at the intersection of the first state 52 and the third state 56. Accordingly, if the classical control mechanism 14 adjusts the control parameter via an adiabatic sweep, that is, adjusting the parameter slowly with respect to the frequencies of the first and second resonators 16 and 18, the state of the resonator/qubit cell/resonator system follows the contour of the avoided crossing 62. For example, if the system began in the |g, 1, 0> state, with the control parameter at the value P1 and the control parameter were adiabatically swept through the first avoided crossing 62, (e.g., from P1 to P2), the system would be in the |e, 0, 0> state after the transition.

Similarly, the coupling between the qubit cell 12 and the second resonator 18 results in a second avoided crossing 64 at the intersection of the first state 52 and the fourth state 58, such that during an adiabatic sweep, the state of the system follows the contour of second avoiding crossing. For example, if the system began in the |e, 0, 0> state with the control parameter at P2, and the control parameter were adiabatically swept through the second avoided crossing 64, (e.g., from P2 to P3), the system would be in the |g, 0, 1> state after the transition. It will thus be appreciated that, through an adiabatic sweep of the classical control mechanism from the value P1 to P3, quantum information within the first resonator 16 can be transferred to the second resonator 18. The fidelity of the transfer is a function of the rate at which the classical control parameter is transitioned, such that the fidelity can be made arbitrarily high by lowering the transition rate.

Figure 3:
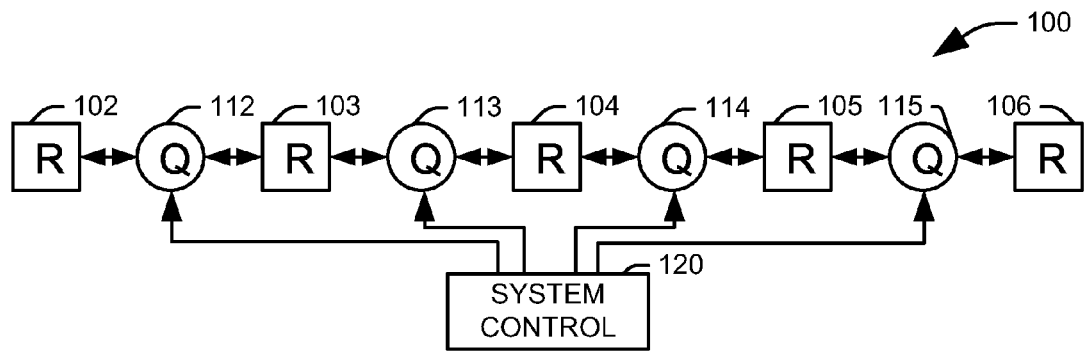
FIG. 3 illustrates an example of a quantum transmission line in accordance with an aspect of the invention.

FIG. 3 illustrates an example of a quantum transmission line 100 in accordance with an aspect of the invention. The quantum resonator transmission line 100 includes a plurality of resonators 102-106 each configured to store at least a portion of a qubit. For example, a given resonator can include a plurality of energy states, and the resonator can include a superposition of quantum states comprising one or more of the plurality of energy states. It will be appreciated that each of the plurality of resonators 102-106 can have a characteristic frequency and a plurality of energy states that are a function of the characteristic frequency.

The quantum transmission line 100 can further comprise a plurality of qubit cells 112-115 each coupled to a corresponding classical control mechanism (not shown) such that the frequency, and thus the corresponding energy, of each qubit is tunable over a predetermined range. In the illustrated implementation, each of the plurality of qubit cells 112-115 is coupled to two of the plurality of resonators 102-106, such that each resonator is separated from its neighboring resonators by a qubit cell. In accordance with an aspect of the present invention, the transmission line can be configured such that each of the resonators (e.g., 102 and 103) coupled to a given qubit (e.g., 112) has a different characteristic frequency. For example, a first set of resonators 102, 104, and 106 can operate at a first frequency (e.g., 10 GHz) and a second set of resonators 103 and 105 can operate at a second frequency (e.g., 15 GHz), and the resonators and qubit cells 112-115 are arranged such that each qubit cell is coupled to a resonator from the first set and a resonator from the second set. The predetermined range over which the qubit cells 112-115 can be tuned can be selected as to encompass the first and second frequencies.

The transmission line can be monitored by a system control 120 that is configured to tune each of qubit cells 112-115 along their predetermined frequency ranges and monitor the location of quantum information within the transmission line. In one implementation, the system control 120 can comprise a conventional (e.g., non-quantum) computer system configured to provide respective control signals to the plurality of classical control mechanisms associated with the plurality of qubit cells as to adjust their associated frequencies and corresponding energy states. In addition, the system control 120 can configured to track the stored location of quantum information within the transmission line as each control signal is provided. Accordingly, quantum information can be passed along the transmission line and retrieved from a known location for use in a quantum logic gate operation.

Figure 4:
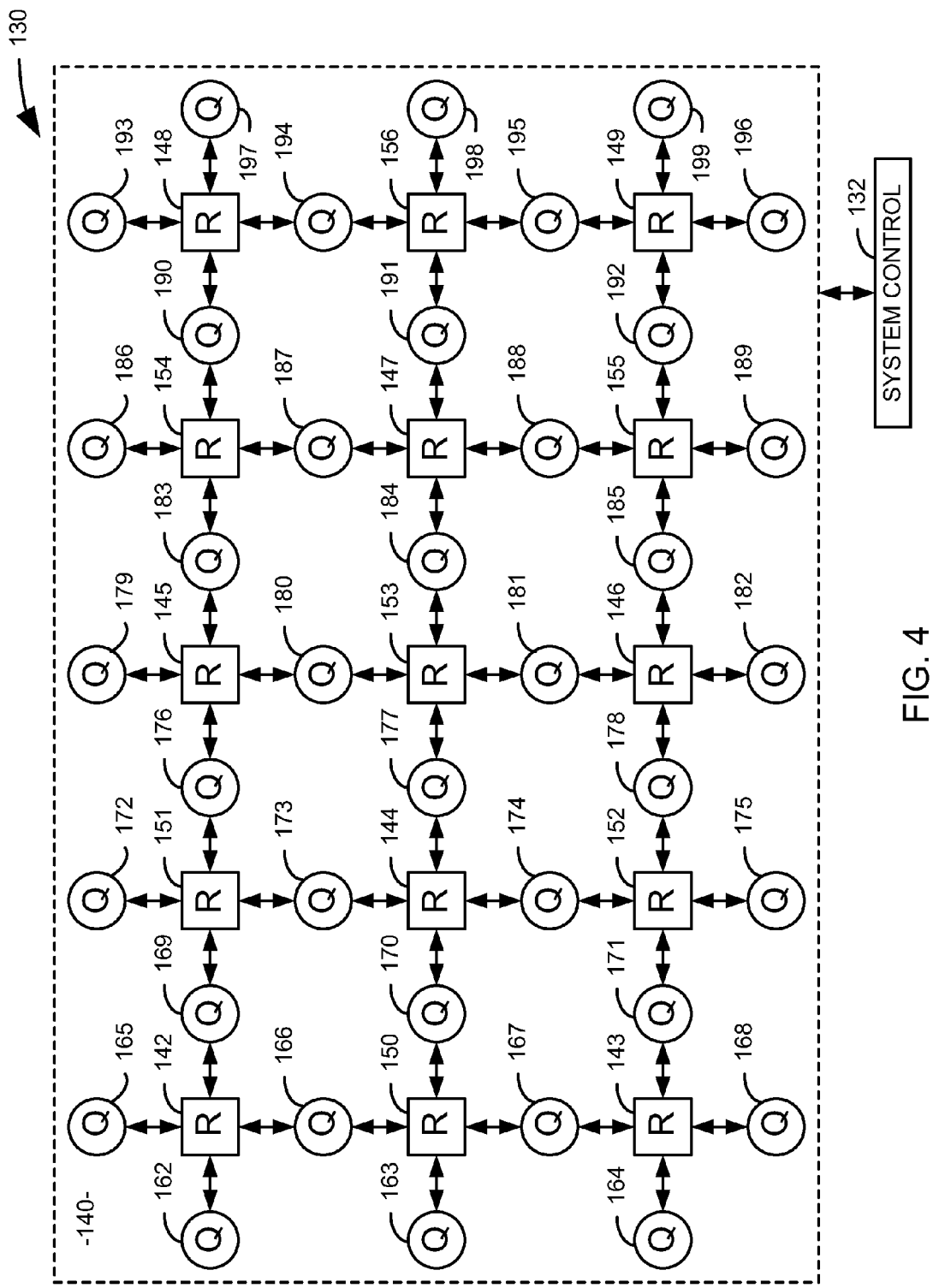
FIG. 4 illustrates an example of a quantum system in accordance with an aspect of the present invention.

FIG. 4 illustrates a quantum system 130 in accordance with an aspect of the present invention comprising a system control 132 and a quantum processor 140. The quantum processor 140 includes a plurality of resonators 142-156 each configured to store all or a portion of the quantum information comprising a qubit. As discussed previously, the implementation of the resonator is not restricted to a particular technology, and for example, the plurality of resonators 142-156 can be configured as transmission line resonators, lumped element resonators, distributed resonators, or a combination thereof. Each of the plurality of resonators 142-156 can have an associated characteristic frequency. In the illustrated implementations, a first set 142-149 of the plurality of resonators 142-156 can have a first associated frequency (e.g., 10 GHz) and a second set 150-156 of the plurality of resonators can have a second associated frequency (e.g., 15 GHz).

The quantum processor 140 further comprises a plurality of qubit cells 162-199 configured to perform logical operations on the stored qubits. In the illustrated implementation, each of the qubit cells can be implemented as any quantum system with a tunable resonant frequency such as one or more of a Josephson junction, a quantum dot, a SQUID (superconducting quantum interference device), a Cooper pair box, or an ion trap. Each qubit cell 162-199 can be coupled to one or more resonators, such that the resonators 142-156 and the qubit cells, taken collectively, can be used to perform logical operations on a qubit.

In accordance with an aspect of the present invention, the plurality of qubit cells 162-199 and the plurality of resonators 142-156 can be arranged in a continuous array such that quantum information can be readily transferred from any resonator in the array to any other resonator in the array. To this end, the plurality of qubit cells 162-199 and the plurality of resonators 142-156 can be arranged such that each qubit cell is coupled to no more than one resonator having a given characteristic frequency. Since in the illustrated implementation, only two characteristic frequencies are used for the plurality of resonators 142-156, this means that each qubit cell 162-199 is coupled to no more than two of the plurality of resonators. To allow for a structure more complex than a transmission line, however, all or most of the resonators (e.g., all of the resonators that are not on a border of the array) can be connected to more than two qubits.

The illustrated implementation of the processor 140 is a simplified version of a quantum processor, and it will be appreciated that a quantum processor in accordance with an aspect of the present invention can be larger in either or both dimensions. However, the arrangement of the qubit cells 162-199 and resonators 142-156 within the illustrated implementation is well suited for the performance of quantum logic gates within the processor, and it will be appreciated that a quantum processor in accordance with an aspect of the present invention could use a similar arrangement. Specifically, each resonator 142-156 can be coupled to four of the qubit cells 162-199, with each qubit cell, other than the qubit cells 162-165, 168, 172, 175, 179, 182, 186, 189, 193, and 197-199 on the border of the array.

As mentioned previously, to allow for facile movement of quantum information through the processor, where two resonators border a given qubit cell, each of the two resonators can have a different characteristic frequency. Accordingly, the qubit cell can be manipulated, as described previously in FIG. 1, to allow the transfer of quantum information between the two resonators. In the illustrated example, the first set of resonators 142-149 and the second set of resonators 150-156 can be arranged in a checkerboard pattern across the array to ensure that no qubit cell is coupled with two resonators of the same frequency. This allows information to be freely passed across the array through manipulation of the plurality of qubit cells 162-199.

In accordance with another aspect of the present invention, the plurality of qubit cells 162-199 can include multiple types of qubit cells, each having a different structure and optimized for a different function. For example, the plurality of qubit cells 162-199 can include a first set of qubit cells 162-164, a second set of qubit cells 197-199, and a third set of qubit cells 165-196, with each set having its own specialized structure that is designed to perform a specific processor function. For example, the first set of qubit cells 162-164 can be optimized for performing a quantum rotation, such as a Hadamard gate or an X gate operation, on a coupled resonator (e.g., 142-144). Such qubit cells 162-164 could be used, for example, for performing an X-gate operation on an empty resonator to load a photon of energy into the processor 140 for processing. To this end, each of the first set 162-164 of qubit cells is configured to have a set of energy states that can be modeled as the state of a spin-½ particle, with associated "spin-up" and "spin-down" states that interact differently with an associated classical control parameter. In one implementation, the first set of qubit cells 162-164 can be constructed as a superconducting flux qubit.

The second set 197-199 of qubit cells can be configured to be easily read to determine the state of one or more qubits stored in the quantum processor 140. For example, the second set 197-199 of qubit cells can include appropriate support equipment for allowing a high fidelity read operation from the qubit cells. The third set 165-196 of qubit cells can be optimized for use in multiple qubit logical gate operations. To this end, each of the third set 165-196 of qubit cells can be implemented, for example, as a single Josephson junction. In one implementation, the third set 165-196 can each be implemented as a superconducting phase qubit.

In accordance with an aspect of the present invention, the system control 132 that is configured to tune respective classical control mechanisms (not shown) associated with the plurality of qubit cells 162-199 along their respective frequency ranges and monitor the location of quantum information within the processor. The system control 132 is configured to provide respective control signals to a plurality of classical control mechanisms (not shown) associated with the plurality of qubit cells 162-199 as to adjust their associated frequencies and corresponding energy states. In addition, the system control 132 tracks the stored location of quantum information within the processor 140, allowing information to be quickly retrieved when it is needed for a logical gate. For example, information stored in one set of resonators can be moved to resonators near one or more specialized qubit cells to allow a specific logical operation to be performed. In one implementation, any information in the processor 140 will be stored in one or more resonators, as the resonators generally have coherence time superior to that of qubit cells, and the remaining qubit cells and resonators are left in their ground states to avoid any interference with the transfer of the stored data.

Figure 5:
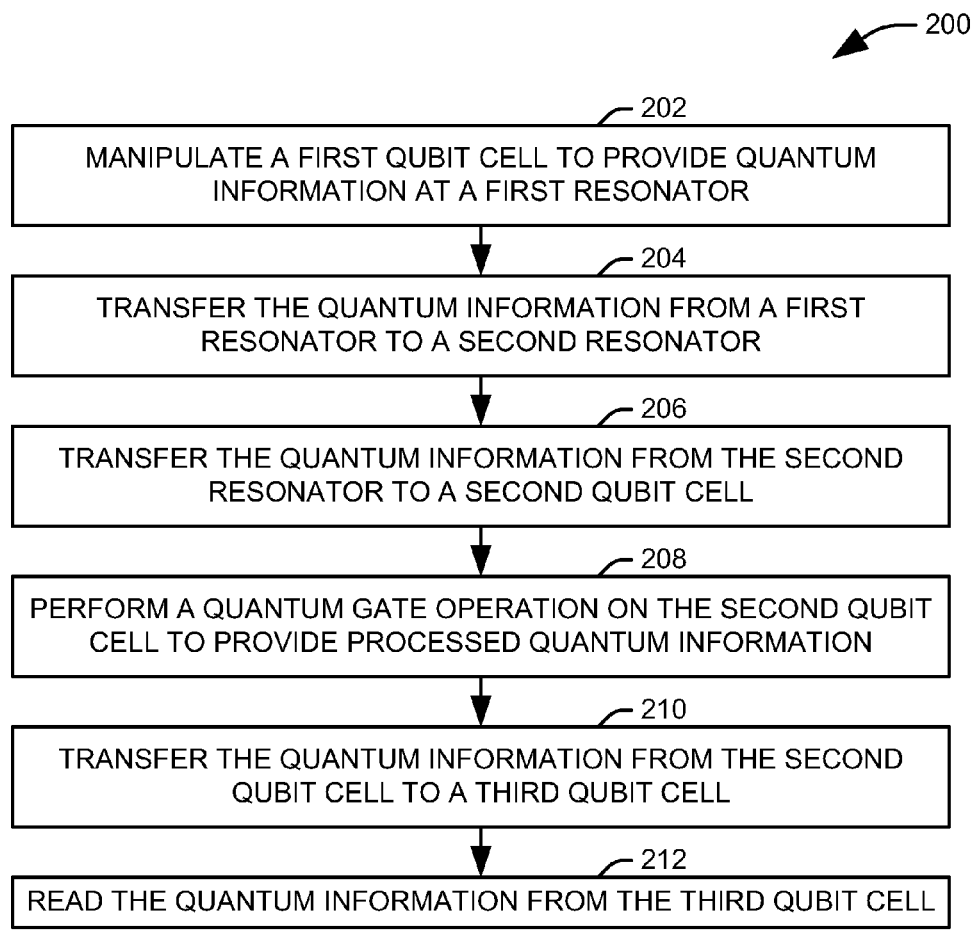
FIG. 5 illustrates an example of a method for performing logical gate operations in a quantum processor in accordance with an aspect of the invention.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates one method 200 for performing a quantum gate operation in accordance with an aspect of the present invention. At 202, a qubit cell optimized for quantum rotations is manipulated to provide an item of quantum information at a first resonator. For example, an X-gate operation can be performed on an associated resonator to place a resonator in a first excited state. Referring to FIG. 4, a first qubit cell 162 can be manipulated to place the first resonator 142 into its first excited state. At 204, the quantum information can be transferred from the first resonator to a second resonator. Referring to FIG. 4, each of a second qubit cell 166, a third qubit cell 170, and a fourth qubit cell 177 can be manipulated in sequence, as described previously in FIGS. 1 and 2, to move the quantum information to the second resonator 153.

At 206, the quantum information is transferred into a qubit cell associated with the second resonator. For example, referring to FIG. 4, the quantum information can be transferred to a fifth qubit cell 180. It will be appreciated that the contents of a given resonator can be transferred to a resonator, for example, by adjusting the classical control parameter associated with the qubit cell to a point in which the qubit cell would be expected to enter an excited state and jumping the classical control parameter back to a default value. In the illustrated implementation, the transfer can be accomplished by adiabatically transitioning the classical control parameter to the value labeled P2 and then jumping the classical control parameter to the value marked P1.

At 208, a quantum logic gate operation is performed on the information stored in the qubit cell associated with the second resonator controlled by at least one other qubit coupled to the second resonator to provide a processed item of quantum information. For example, referring to FIG. 4, a controlled NOT gate on the fifth qubit cell 180 can be performed using a sixth qubit cell 184 as a control for the gate. A method for providing a quantum controlled NOT gate is described in some detail in U.S. application Ser. No. 12/748,923, titled "QUANTUM GATE OPERATIONS WITH A COMMON COUPLED RESONATOR" and referenced above. It will be appreciated that each of the fifth qubit cell 180 and the sixth qubit cell 184 can be constructed to have an optimal configuration for performing multiple qubit logic operations. For example, any support circuitry for reading the states of the qubit cells 180 and 184 can be omitted.

At 210, the processed item of quantum information is transferred from the qubit cell associated with the second resonator to a destination qubit cell optimized for read operations. For example, referring to FIG. 4, a seventh qubit cell 197 can be optimized for read operations, and the processed item of quantum information can be transferred to the seventh qubit cell 197 from the fifth qubit cell 180. In one implementation, the information in the fifth qubit cell 180 can be transferred to a third resonator 145, and transferred from the third resonator to a fourth resonator 148 by adjusting the energies of an eighth qubit 183 and a ninth qubit 190 in an appropriate sequence. The information can then be passed from the fourth resonator 148 to the seventh qubit cell 197, with which it is directly coupled, as described previously. The information in the destination qubit cell can then be read at 212.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the scope of the appended claims.

What is claimed is:

1. A quantum processor system comprising:
   a plurality of resonators configured to store quantum information;
   a first set of a plurality of qubit cells configured for a first logical operation, each of the first set of qubit cells being coupled to at least one of the plurality of resonators;
   a second set of the plurality of qubit cells configured for a second logical operation, each of the second set of qubit cells being coupled to at least one of the plurality of resonators; and
   a third set of the plurality of qubit cells configured for a third logical operation, each of the third set of qubit cells being coupled to at least one of the plurality of resonators.

2. The quantum processor system of claim 1, the first logical operation being a read operation that determines the state of a given qubit cell, such that each of the first set of the plurality of qubit cells comprises appropriate support equipment for allowing a high fidelity read operation.

3. The quantum processor system of claim 1, the first logical operation being a quantum rotation of the state of an associated resonator, such that each of the first set of the plurality of qubit cells is configured to have a set of energy states that can be modeled as the state of a spin-½ particle, with first and second states that interact differently with an associated classical control parameter.

4. The quantum processor system of claim 3, each of the first set of the plurality of qubit cells comprising a superconducting flux qubit.

5. The quantum processor system of claim 1, the first logical operation being a multiple qubit logical gate operation such that each of the first set of the plurality of qubit cells comprises a single Josephson junction.

6. The quantum processor system of claim 1, further comprising a system control configured to track the location of quantum information within the plurality of resonators and the plurality of qubit cells.

7. The quantum processor system of claim 1, the plurality of qubit cells and the plurality of resonators being arranged in a continuous array such that quantum information can be readily transferred from any resonator in the array to any other resonator in the array.

8. The quantum processor system of claim 7, the plurality of resonators comprising a first set of resonators, each having a first characteristic frequency, and a second set of resonators, each having a second characteristic frequency.

9. The quantum processor system of claim 8, each of the plurality of qubit cells and the plurality of resonators are arranged such that no qubit cell is coupled to more than one resonator having a given characteristic frequency.

* * * * *